United States Patent [19]

Sakai

[11] Patent Number: 5,650,732
[45] Date of Patent: Jul. 22, 1997

[54] SEMICONDUCTOR DEVICE TEST SYSTEM

[75] Inventor: Iwao Sakai, Itami, Japan

[73] Assignee: Mitsubishi Denki Kabushiki Kaisha, Tokyo, Japan

[21] Appl. No.: 266,566

[22] Filed: Jun. 28, 1994

[30] Foreign Application Priority Data

Jul. 2, 1993 [JP] Japan .................................. 5-164585

[51] Int. Cl.$^6$ ........................................... G01R 31/02
[52] U.S. Cl. ........................ 324/755; 324/760; 324/754
[58] Field of Search ....................... 324/755, 760, 324/158.1, 765, 754; 414/416; 29/741, 740, 739

[56] References Cited

U.S. PATENT DOCUMENTS

| | | | |
|---|---|---|---|
| 4,817,273 | 4/1989 | Lapa et al. | 29/741 |
| 4,926,118 | 5/1990 | O'Connor et al. | 324/760 |
| 5,093,984 | 3/1992 | Lapa | 29/741 |
| 5,148,100 | 9/1992 | Sekiba | 324/765 |
| 5,227,717 | 7/1993 | Tsuvishima et al. | 324/754 |
| 5,295,294 | 3/1994 | Ito | 29/740 |
| 5,313,156 | 5/1994 | Klug et al. | 324/158.1 |

*Primary Examiner*—Kenneth A. Wieder
*Assistant Examiner*—Kourosh Cyrus Khosravi
*Attorney, Agent, or Firm*—Leydig, Voit & Mayer

[57] ABSTRACT

A semiconductor device test system for efficiently testing many types of devices and for reducing the amount of floor space needed. The test system has a test board having a plurality of sockets for receiving semiconductor devices. A semiconductor device insertion and extraction station removes the devices from a tray and inserts them into the sockets of the test board and extracts the devices from the sockets to mount them on the tray. A test chamber has a temperature setting section for setting the test board to a test environmental temperature and a test-performing section for supporting the test board so that electrode terminals of the sockets are exposed. A tester head is simultaneously connected to the electrode terminals of the sockets of the test board. A head moving section connects the tester head to the electrode terminals of the sockets of the test board. A tester is connected to the tester head to test electrical characteristics of the semiconductor devices.

19 Claims, 6 Drawing Sheets

SEMICONDUCTOR DEVICE TEST SYSTEM

BACKGROUND OF THE INVENTION

1. Field of the Invention

The present invention relates to a test system for testing characteristics of semiconductor devices and to a semiconductor device insertion and extraction station and a test chamber used for such a test system.

2. Description of the Related Art

A conventional test handler is shown in FIG. 10. The test handler has a tester station head 3 connected to a tester (not shown). Connected to the tester station head 3 is a test handler board 4 provided with a plurality of contactors. A locating press mechanism 6 is arranged above the test handler board 4 to connect a plurality of semiconductor devices 2 mounted on a tray 1 to corresponding respective contactors 5. The test handler is also provided with transfer means for transferring the tray 1, a preheat section 8 for preheating the semiconductor devices 2 before testing and a grouping section 7 for grouping the tested semiconductor devices 2 into non-defective and defective products.

After the semiconductor devices 2 are preheated to a predetermined test temperature while remaining on the tray 1, they are transferred immediately above the test handler board 4. Then, each of the semiconductors 2 is pressed against a corresponding contactor 5 by the locating press mechanism 6 and electrically connected to the station head 3 via the contactor 5 and the test handler board 4. In such a state, the electrical characteristics test is simultaneously performed by the tester (not shown) on a plurality of semiconductor devices 2 mounted on the tray 1.

After the completion of the test on the semiconductor devices 2 as described above, the locating press mechanism 6 is raised and the tray 1 placed immediately above the test handler board 4 is fed to the grouping section 7. The subsequent tray 1 which has been preheated in the preheat section 8 replacing the preceding tray is transferred immediately above the test handler board 4, and similarly, the test is performed on the semiconductor devices 2. The semiconductor devices 2 mounted on the tray 1 transferred to the grouping section 7 are grouped into non-defective and defective products according to the test results.

As described above, since the plurality of semiconductor devices 2 mounted on the tray 1 are simultaneously tested, efficient testing can be performed by the conventional test handler particularly when testing a large number of a single type of device in which each of the devices requires a short test time.

However, the conventional test handler presents the following problems. Along with the recent trend moving toward high density semiconductor devices and complicated circuits, the time required for testing a single semiconductor device becomes longer. There is also a trend in producing many types of semiconductor devices of varying the production quantity according to the type of semiconductor device. Thus, the operation efficiency of expensive mechanisms, such as the locating press mechanism 6, and the like, are lowered, and also, the test handler boards 4 and the locating press mechanisms 6 have to be frequently exchanged to correspond to the type of device and package.

Further, since the transfer means (not shown) horizontally transfers the tray 1, the test handler requires a large floor area, thus lowering space use efficiency.

SUMMARY OF THE INVENTION

Accordingly, in order to solve the above problems, an object of the present invention is to provide a semiconductor device test system for efficiently testing many types of semiconductor devices and also reducing the amount of floor space needed.

Another object of the present invention is to provide a semiconductor device insertion and extraction station and a test chamber used for such a semiconductor device test system.

In order to achieve the above objects, according to a first aspect of the present invention, there is provided a semiconductor device test system comprising: a test board having a plurality of sockets for receiving semiconductor devices; a semiconductor device insertion and extraction station for removing the semiconductor devices from a tray having the semiconductor devices mounted thereon so as to insert them into the sockets of the test board and extracting the semiconductor devices from the sockets so as to mount them on the tray; a test chamber having a temperature bringing section for setting the test board to a test environmental temperature and a test-performing section for supporting the test board so that electrode terminals of the sockets can be exposed, the test chamber sequentially placing the plurality of test boards in the temperature setting section and the test-performing section, said test boards having the semiconductor devices inserted into the sockets by the semiconductor device insertion and extraction station; a tester head simultaneously connected to the electrode terminals of the plurality of sockets of the test board; a head moving section for moving the tester head for connecting and disconnecting the tester head and the electrode terminals of the sockets of the test board placed in the test-performing section of the test chamber; and a tester connected to the tester head so as to test electrical characteristics of the plurality of semiconductor devices inserted into the sockets of the test board placed in the test-performing section of the test chamber.

According to a second aspect of the present invention, there is provided a semiconductor device insertion and extraction station comprising: a plurality of trays including a plurality of pockets arranged at predetermined pocket pitches to have semiconductor devices mounted thereon, the pockets corresponding to the type of semiconductor devices; a tray placing portion for placing the plurality of trays; a plurality of locating stages for locating the corresponding types of semiconductor devices; a plurality of test boards including a plurality of sockets arranged at predetermined socket pitches for receiving the corresponding type of semiconductor devices thereinto; a test board placing portion for placing the plurality of test boards; and a robot for removing the semiconductor devices from the tray placed on the tray placing portion so as to place them on one of the locating stages corresponding to the type of semiconductor devices, the robot displacing the semiconductor devices from the locating stage to the test board placing portion so as to insert them into the sockets of the test board corresponding to the type of semiconductor devices.

According to a third aspect of the present invention, there is provided a test chamber comprising: a square prism-shaped rotary chamber rotatable around the center shaft of the square prism and having an opening on each of lateral surfaces of the square prism; and a plurality of supporting means corresponding to the respective plurality of lateral surfaces of the rotary chamber and supporting a test board on the inside of each of the lateral surfaces of the rotary chamber so that an electrical terminal of each of a plurality of sockets provided for the test board for receiving semiconductor devices can be exposed to the exterior through the opening, wherein the supporting means are placed in a first position by rotating the rotary chamber to insert the test boards into and extract the test boards from the supporting means and place the test boards in a second position so as to perform a test via the electrical terminals of the sockets on the semiconductor devices mounted on the test boards which are supported by the supporting means.

DESCRIPTION OF THE PREFERRED EMBODIMENT

An embodiment of the present invention will be described with reference to the accompanying drawings.

Figure 1:
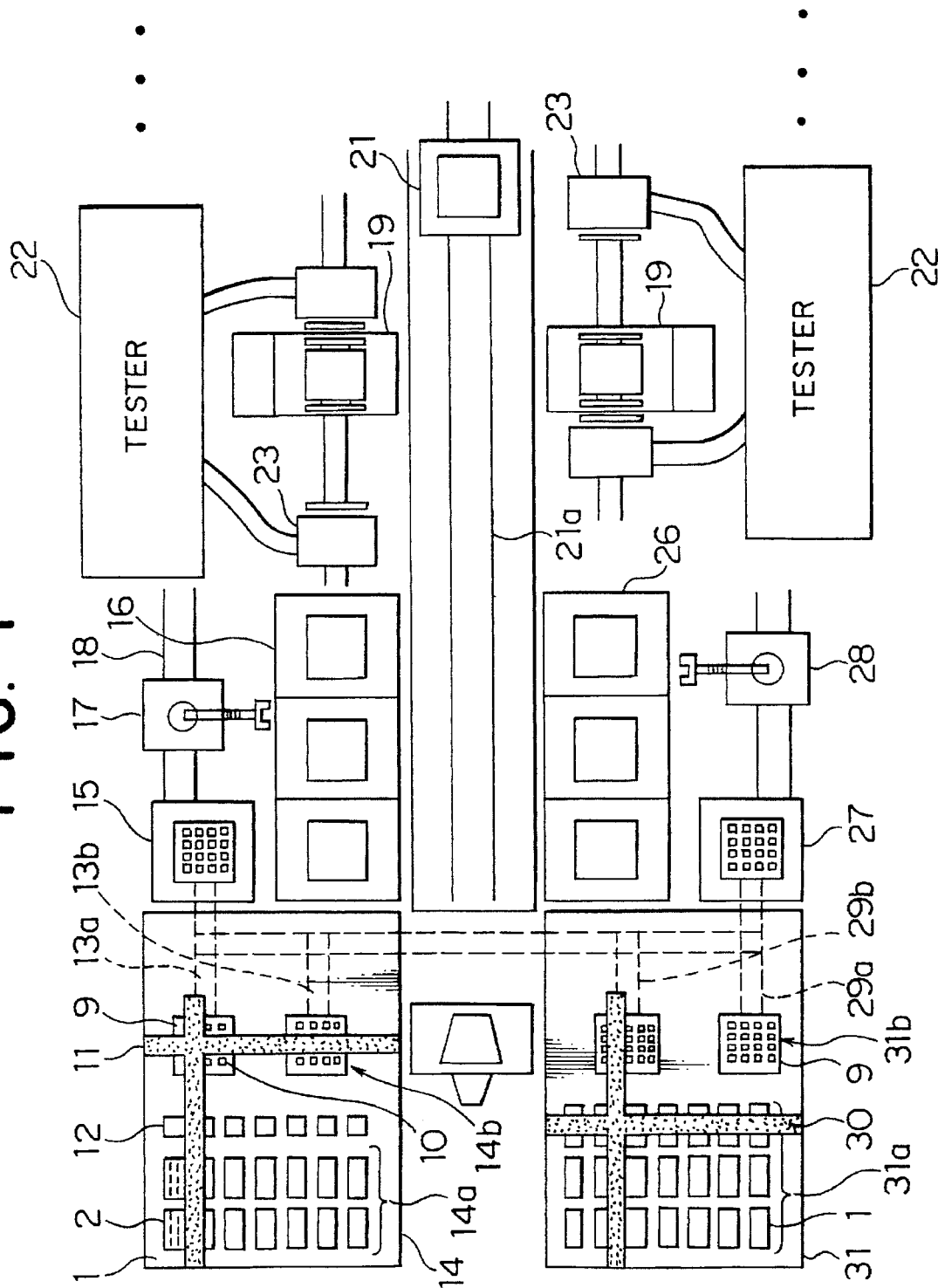
FIG. 1 is a top view of a semiconductor device test system according to one embodiment of the present invention.

FIG. 1 illustrates a semiconductor device test system according to one embodiment of the present invention. An insertion station 14 and an extraction station 31 are arranged parallel to each other. A rotary cleaning stage 15, a storage unit 16 and a moving robot 17 are arranged adjacent to the insertion station 14. A storage unit 26, a rotary stage 27 and a moving robot 28 are arranged adjacent to the extraction station 31. A transfer robot 21 is placed between the storage units 16 and 26, and a plurality of test chambers 19 are placed in the vicinity of the transfer robot 21. A tester provided with a tester head 23 is placed in the vicinity of each of the test chambers 19.

The insertion station 14 comprises: a tray placing portion 14a for placing a plurality of trays 1; a plurality of locating stages 12 for locating corresponding types of semiconductor devices 2; a test board placing portion 14b for placing a plurality of test boards 9; and an orthogonal robot 11 for attracting the semiconductor devices 2 and moving them on the insertion station 14. 13a and 13b indicate transfer passages of the test boards 9 in FIG. 1.

The extraction station 31 comprises: a tray placing portion 31a for placing a plurality of trays 1; a test board placing portion 31b for placing a plurality of test boards 9; and an orthogonal robot 30 for attracting the semiconductor devices 2 and moving them on the extraction station 31. 29a and 29b indicate transfer passages of the test boards 9 in FIG. 1.

Figure 2:
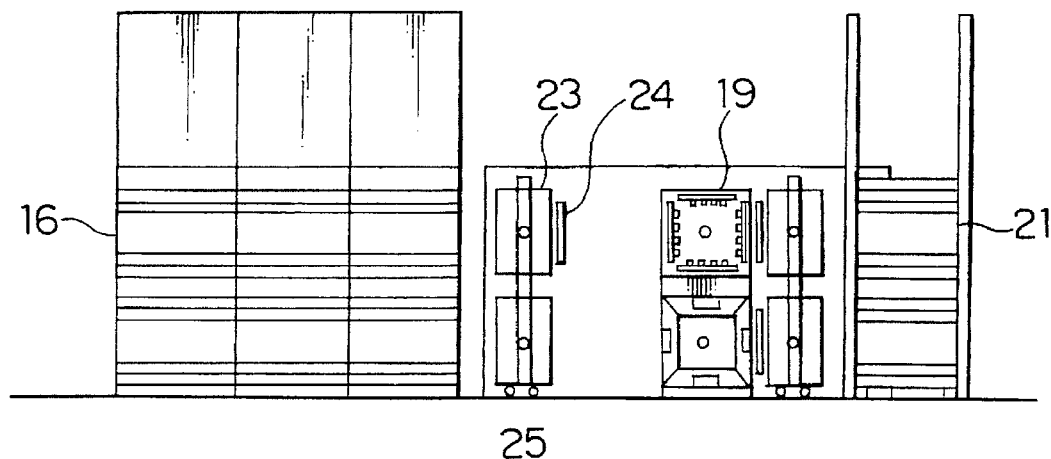
FIG. 2 is a front view of a portion of the test system shown in FIG. 1.

As illustrated in FIG. 2, the tester head 23 is provided with an adapter board 24 for scrambling electrical signals and is supported by a three-dimensional slide manipulator 25 so that it can be three-dimensionally moved. The transfer robot 21 has eight vertically movable shelves which are capable of supporting the eight test boards at one time.

Figure 3:
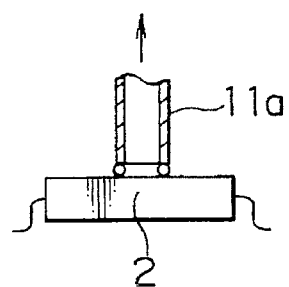
FIG. 3 is a sectional view of an attraction head provided for an orthogonal robot of an insertion station.

Each of the orthogonal robots 11 and 31 of the insertion station 14 and the extraction station 31, respectively, is provided with an attraction head 11a shown in FIG. 3, for grasping and supporting the semiconductor devices 2.

Figure 4:
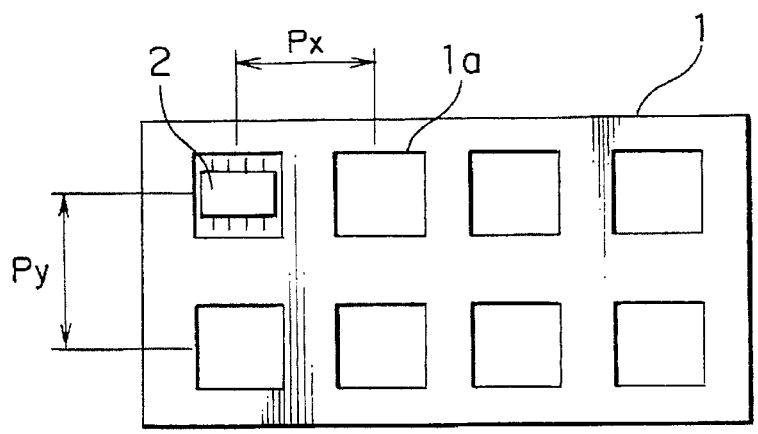
FIG. 4 is a top view of a tray.

Each of the trays 1 is manufactured to correspond to the type of semiconductor device 2 to be mounted thereon. As shown in FIG. 4, each tray has a plurality of pockets 1a for accommodating specific types of semiconductor devices 2, but each of the outer dimensions of the trays 1, the arrangement pitches of the pockets 1a, that is, the pocket pitches Px and Py, is unified for all the trays 1 regardless of the types of semiconductor devices 2.

Figure 5:
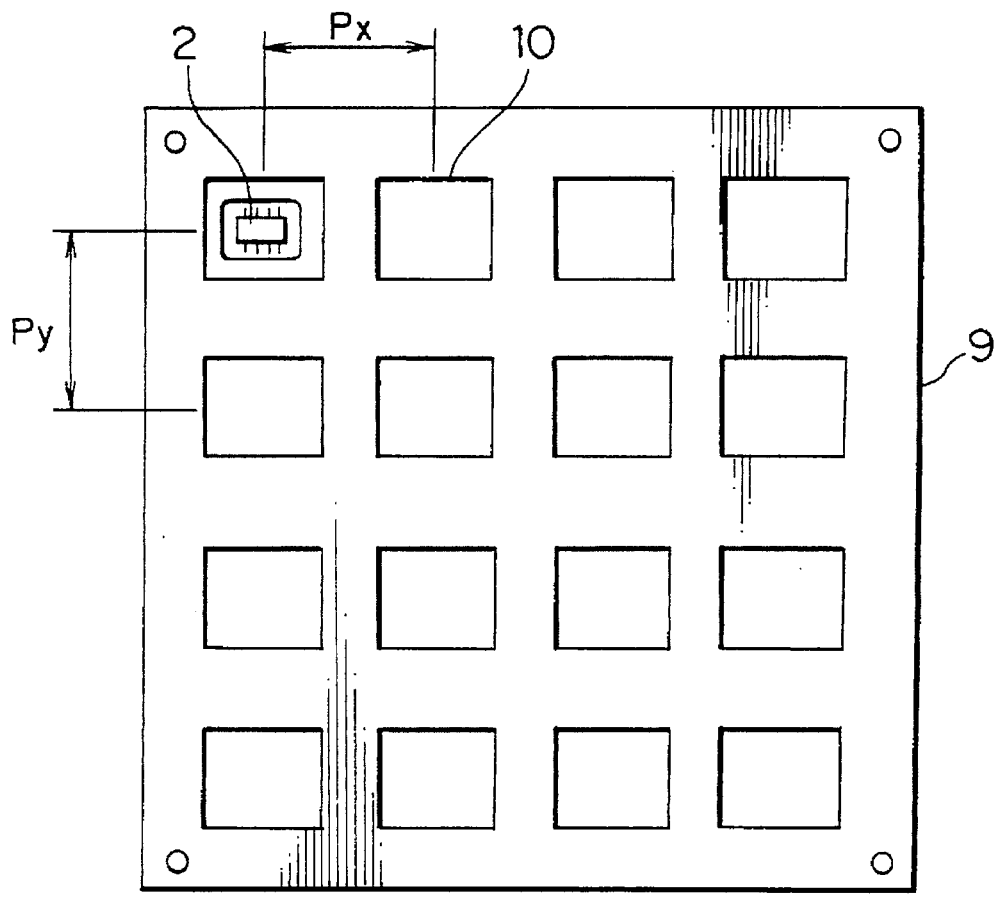
FIG. 5 is a top view of a test board.

Likewise, each of the test boards 9 is manufactured according to the type of semiconductor device 2 to be mounted thereon. As illustrated in FIG. 5, each test board has a plurality of sockets 10 for receiving the specific types of semiconductor devices 2, but each of the outer dimensions of the test boards 9 and the sockets 10 is unified for all the test boards 9 regardless of the type of device 2. Also, the pitches of the sockets 10, that is, the socket pitches, are the same as the pocket pitches of the tray 1, that is, Px and Py. Each of the sockets 10 is an IC socket having the same outer dimension regardless of the shape of the device 2 according to a zero insertion method employed as follows. An insertion/extraction head arranged at the intersection point of the orthogonal robot 11/30, respectively, presses each of the standardized points at the top of the socket so as to open the contactor. The insertion head lowers the device 2 so as to locate it in the socket or the extraction head removes the device 2. Then, the insertion/extraction head is raised to close the contactor, thereby completing the insertion/extraction of the device 2.

Figure 6:
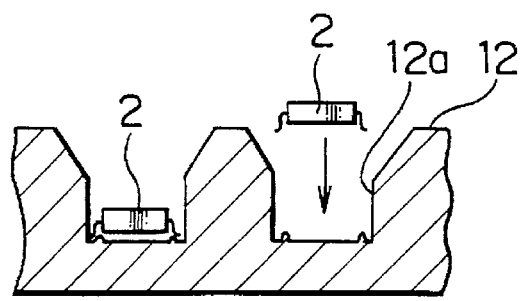
FIG. 6 is a sectional view of a locating stage.

As shown in FIG. 6, a plurality of locating holes 12a are formed on each of the locating stages 12 so as to be arranged with the same pitches Px and Py as those of the pockets 1a of the tray 1 and the sockets 10 of the test board 9. The semiconductor devices 2 are inserted into such locating holes 12a so that they can be easily located therein.

An explanation will now be given of the operation of this embodiment. The tray 1 having a plurality of semiconductor devices 2 mounted thereon is first placed on the tray placing portion 14a of the insertion station 14 according to the type of devices 2, and at the same time, one of empty test boards 9 without semiconductor devices 2 is also placed on the test board placing portion 14b. The plurality of semiconductor devices 2 on the tray 1 are simultaneously drawn to the attraction head 11a of the orthogonal robot 11 and inserted into the locating holes 12a of the locating stage 12 corresponding to the type of semiconductor device 2 so that they can be located. Then, they are again drawn to the attraction head 11a from the locating stage 12 and concurrently inserted into the plurality of sockets 10 of the empty test board 9 on the test board placing portion 14b.

The tray 1 and the test board 9 are provided with bar code information, and the like, indicative of the type of semiconductor devices 2 and packages, thereby recognizing such a type and determining the corresponding locating stage 12.

As stated above, the outer dimension of each of the trays 1, the test boards 9 and the sockets 10 is unified, i.e., uniform and the arrangement pitches of the pockets of the tray 1, the sockets of the test board 9 and the locating holes 12a of the locating stage 12 are all unified, thus eliminating the necessity of exchanging the attraction heads 11a of the orthogonal robot 11 according to the type of semiconductor devices 2, packages, and the like.

In the embodiment shown in FIG. 1, the test board placing portion 14b of the insertion station 14 is capable of placing two test boards 9 at a time. While the semiconductor devices 2 are being inserted into one of the test boards 9, the other test board 9 is stationed on standby, thereby improving the operation efficiency of the orthogonal robot 11. A storage unit (not shown) is arranged adjacent to the insertion station 14 from which unit the trays 1 and the test boards 9 are supplied. Further, a plurality of insertion stations 14 of similar construction may be arranged adjacent to each other, thereby improving the operation capacity.

The test board 9 having the semiconductor devices 2 inserted therein passes through the transfer passage 13a or 13b and is fed to the rotary cleaning stage 15 in which an electrode provided on the reverse surface of the test board 9 is cleaned by such means as air blowing, and it is then stored within the storage unit 16 by the moving robot 17. At this time, the moving robot 17 calculates the vertical insertion direction of four test boards 9 which will be afterwards simultaneously inserted into the test chamber 19 and rotates the test boards 9 in a predetermined direction based on the calculation results so as to store them in the storage unit 16. Alternatively, the test boards 9 may be rotated 180° in the rotary cleaning state 15 as needed.

A group of four test boards 9 is removed from the storage unit 16 by the transfer robot 21 based on the signal from the tester 22 and passes through a center transfer passage 21a to a predetermined test station. The transfer robot 21 is vertically movable so that it can concurrently remove a plurality of test boards 9 from the storage unit 16 at a desired position. The four test boards 9 transferred to the test station are inserted into the test chamber 19.

Figure 7:
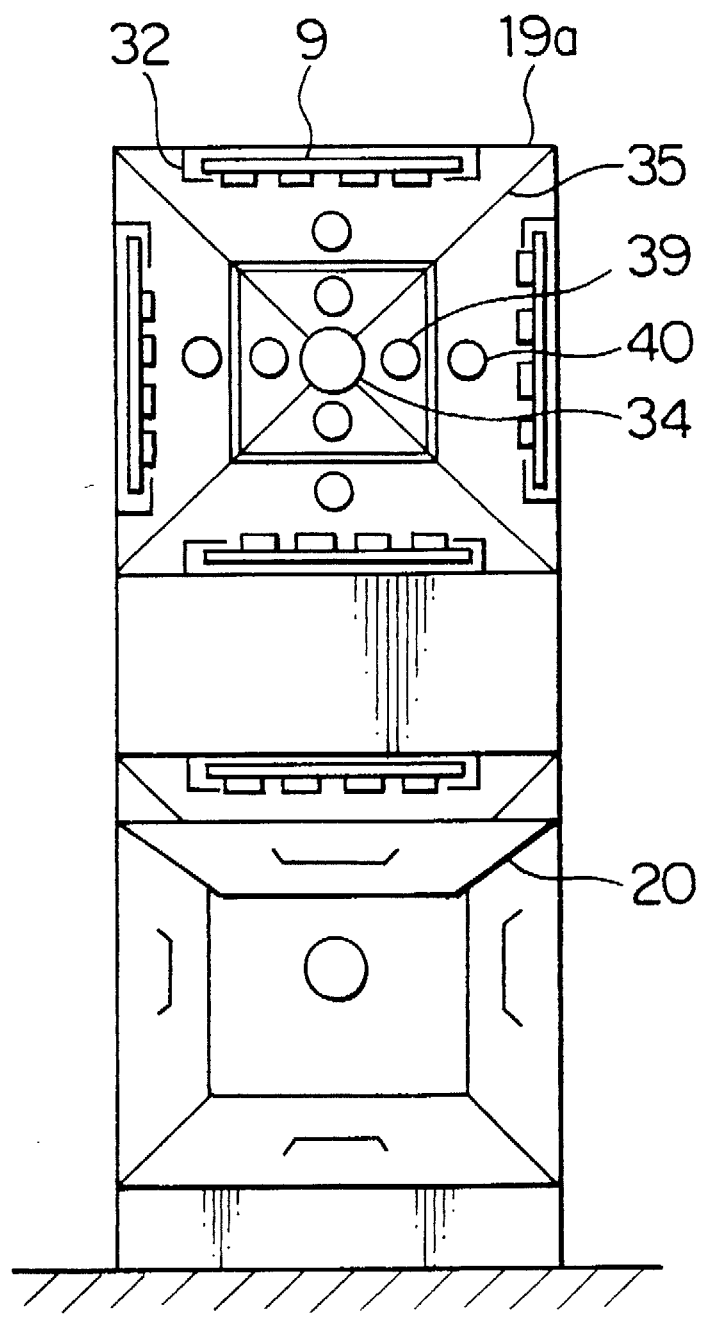
FIG. 7 is a partially cutaway front view of a test chamber.
Figure 8:
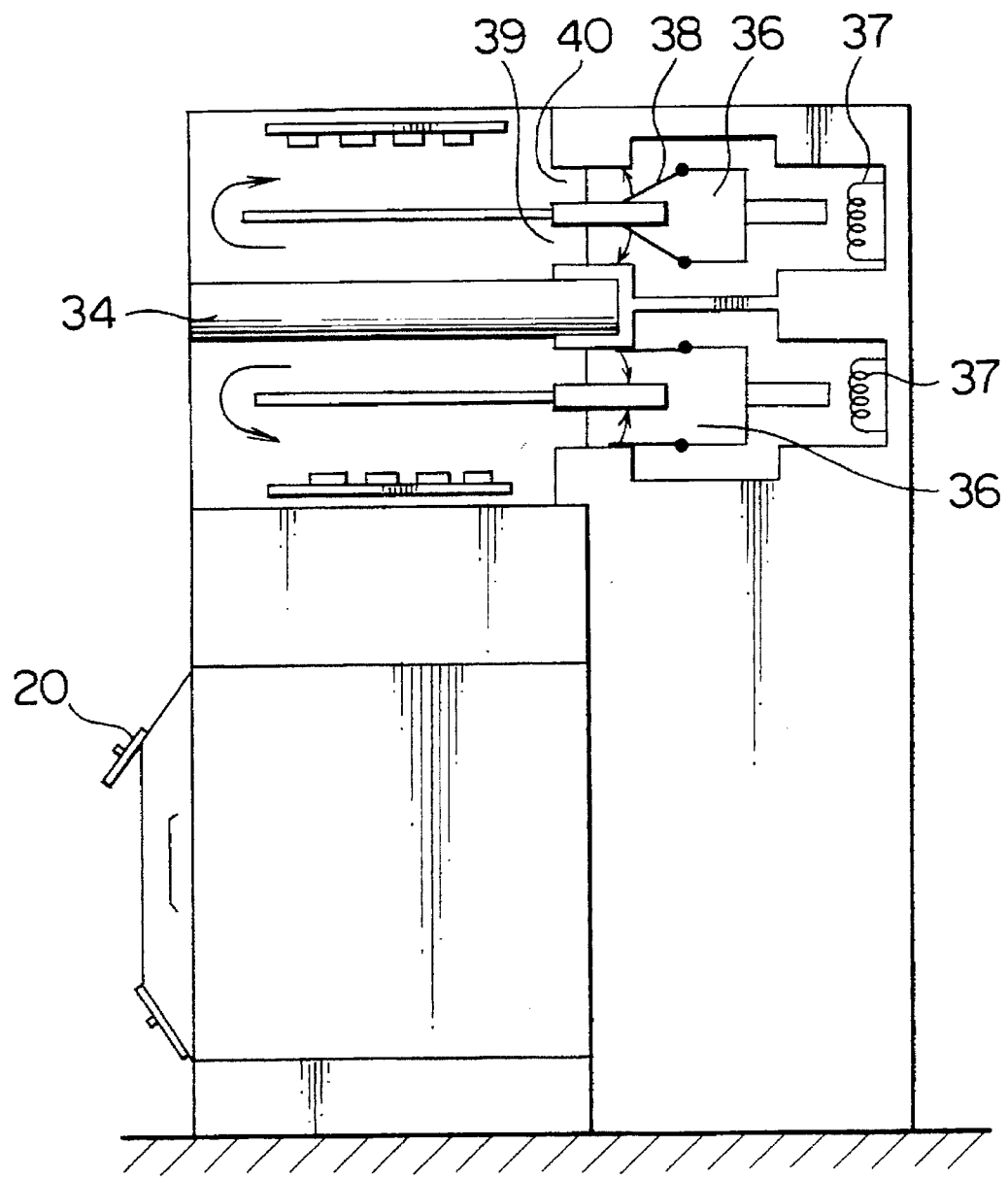
FIG. 8 is a partially cutaway side view of the test chamber.
Figure 9:
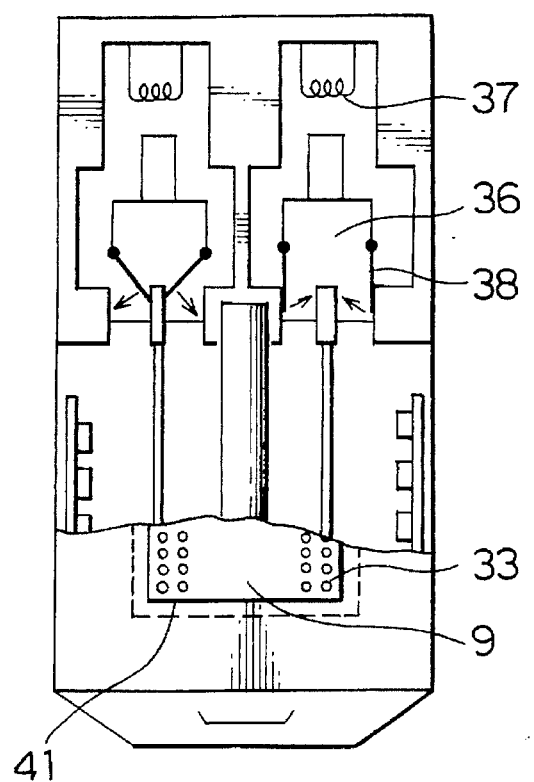
FIG. 9 is a partially cutaway top view of the test chamber.

The construction of the test chamber 19 is shown in FIGS. 7–9. As illustrated in FIG. 7, the test chamber 19 is provided with two square prism-shaped rotary chambers 19a rotatable around the center shaft 34. Each of the rotary chambers 19a is partitioned into four chamber portions around the center shaft 34 across heat insulating walls 35. Each of the chamber portions is provided with a locating guide 32 used as supporting means for supporting the test board 9 on the inside of the lateral surface of the square prism. It is also provided with an air outlet 39 and an air inlet 40. A door 20 is also arranged in each chamber portion to freely open and close.

As shown in FIG. 8, a cooler 36 and a heater 37 are connected to the air outlet 39 and the air inlet 40 via a switching valve 38, thereby supplying the cool air from the cooler 36 or the warm air from the heater 37 to the chamber portion by switching the switching valve 38. Also, as shown in FIG. 9, an opening 41 is located on each of the lateral surfaces of the square prism-shaped rotary chamber 19a. The test board 9 is supported by the locating guide 32 so that the electrode 33 on the reverse surfaces of the test board 9 is exposed through the opening 41.

The transfer robot 21 stops in front of the test chamber 19 so as to allow the horizontally-placed four doors 20 of each of the two rotary chambers 19a to automatically open, thereby simultaneously removing from each of the chamber portions the four test boards 9 in horizontal positions. Those test boards already have been tested in the previous test. At this point, the transfer robot 21 accommodates both four untested boards 9 transferred from the storage unit 16 and four tested boards 9 removed from the test chamber 19 on the built-in shelves. The transfer robot 21 vertically slides the shelf to support each of the four untested boards 9 by means of the locating guides 32 of the four chamber portions with the doors 20 open. Thereafter, the doors 20 are automatically closed.

The four tested boards 9 removed from the test chamber 19 are transferred onto the center transfer passage 21a by the transfer robot 21 so as to be stored in the storage unit 26. In this state, two of the four test boards 9 are upside down, that is, with the sockets 10 facing downward. Subsequently, the moving robot 28 removes the tested boards 9 from the storage unit 26 one by one and places them on the rotary stage 27. At this time, the moving robot 28 rotates the upside-down test boards 9 at 180° so the sockets 10 face upward and to place them on the rotary stage 27.

The test boards 9 on the stage 27 are fed onto the extraction station 31. It should be noted that the test boards 9 reversely displaced horizontally from those in the insertion station 14 are rotated 180° on the rotary stage 27 and then fed onto the extraction station 31. The semiconductor devices 2 inserted into the test boards 9 are extracted from the sockets 10 by the orthogonal robot 30 so as to be stored in a predetermined tray 1 placed on the tray placing portion 31a. At this time, the grouping operation is performed based on the bar code information of the test board 9 and corresponding test results.

The extraction station 31 is commonly constructed as the insertion station 14, except that it has a grouping mechanism substituted for the locating stage 12, and performs an operation totally reverse to that of the insertion station 14.

On the other hand, the four untested boards 9 horizontally inserted into the test chamber 19 are preheated to a test environmental temperature while remaining in the same position until the test on the vertically-placed four test boards 9 is completed. A method of setting a temperature is employed as follows. When a test environmental temperature is lower than the chamber temperature, the switching valve 38 is placed so as to introduce cool air into the chamber from the cooler 36 by a fan (not shown) through the air outlet 39 and also to form the air circulation that is discharged through the air inlet 40. Conversely, when a test environmental temperature is higher than the chamber temperature, the switching valve 38 is tilted so as to introduce the warm air into the chamber portion supplied from the heater 37 with the fan through the air outlet 39 and also to form the air circulation that is discharged through the air inlet 40.

Upon a completion of the test on the four horizontally-placed test boards 9, a slide manipulator 25 slides to and removes the tester head 23 from the test board 9. Subsequently, the rotary chambers 19a of the test chamber 19 are rotated at 90° around the center shaft 34 so that the vertically-placed tested boards 9 are horizontally placed while the preheated stationed test boards 9 which thus far have been on standby are displaced from the horizontal state to the vertical state in which they are ready for the test.

The slide manipulator 25 then slides to electrically connect the tester head 23 to the electrodes 33 on the reverse surfaces of the vertically-placed test boards 9 through the opening 41 of the rotary chamber 19a. Pogo-pin or zero insertion connectors, or the like, are used to perform such an electrical connection. In such a state, characteristics of the plurality of semiconductor devices 2 mounted on the test board 9 are tested by the tester 22 via the tester head 23 and the adaptor board 24.

The adaptor board 24 allocates the signals from the tester head 23 to the plurality of semiconductor devices 2 on the test board 9. The slide manipulator 25 is constructed to be slidable close to or away from the test chamber 19. The slide manipulator 25 may also be movable in the three-dimensional directions, X, Y and Z, thus measuring the semiconductor devices 2 on one test board 9 while changing them by a few devices at a time. Such a modification is particularly effective when the tester head 23 is capable of measuring only a small number of semiconductor devices 2 at one time.

Also, since the rotary chamber 19a is partitioned into a plurality of chamber portions across the heat insulating walls 35, and the cooler 36 and the heater 37 are provided for each of the chamber portions, it is possible to set an independent temperature in each chamber portion. Further, the switching valve 38 may be actuated in real time. Thus, even when the rotary chamber 19a is rotated to change the position of each chamber portion, it is also possible to maintain the temperature environment in each chamber portion without changing the positions of the cooler 36 and the heater 37.

Figure 10:
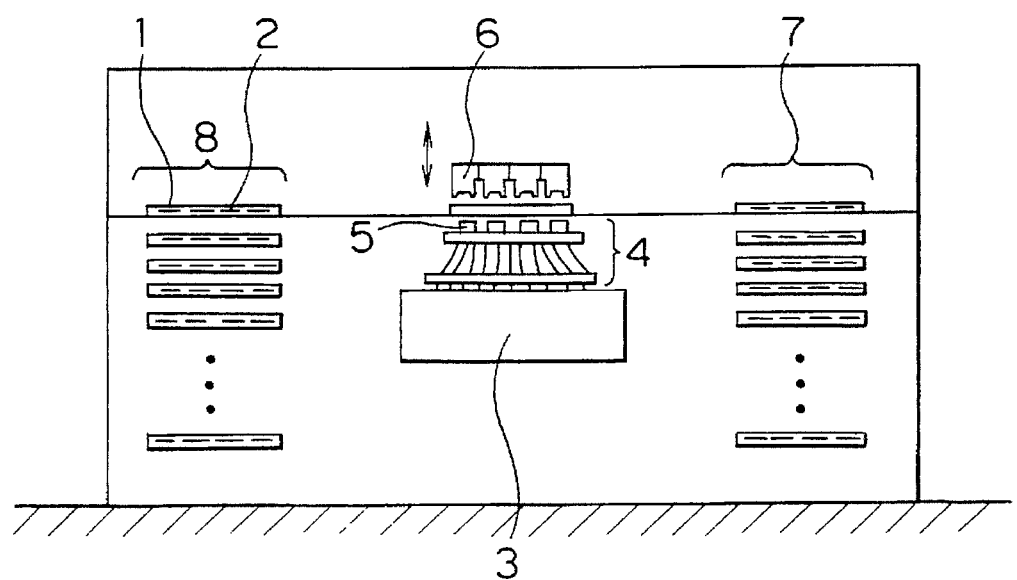
FIG. 10 illustrates a conventional test handler.

In the embodiment described above, instead of using the test chamber 19 and the slide manipulator 25, a horizontally-transferring handler shown in FIG. 10 may be used and the test board 9 and the adapter board 24 may be substituted for the tray 1 and the handler board 4 illustrated in FIG. 10, respectively, thus adding a mechanism for connecting or separating the test board 9 and the adapter board 24. In such a case, advantages similar to those in the above embodiment can also be obtained for semiconductor devices requiring a short test time.

Also, in this case, the transfer passage of the test boards 9 may be branched before the test section so that the two test boards 9 can be simultaneously placed in the test section in which one of the boards 9 is tested in the test section while the other board 9 replaces a previously tested board. The test boards 9 provided for testing may be selected by switching a relay arranged within the tester head or on the adapter board 24, thereby eliminating the time required for switching the test boards 9.

What is claimed is:

1. A semiconductor device test system comprising:
   a semiconductor device insertion station for removing semiconductor devices from a tray and inserting the semiconductor devices into sockets of a test board;
   a semiconductor device extraction station for extracting the semiconductor devices from the sockets and mounting the semiconductor devices on a tray;
   a test chamber for housing the test board during testing;
   a tester head located outside the test chamber and having a connecting portion for simultaneous electrical connection to electrode terminals of the sockets of the test board;
   a head moving section for moving the connecting portion of the tester head into and out of electrical contact with the electrode terminals of the test board; and
   a tester electrically connected to the tester head for testing electrical characteristics of the semiconductor devices in the test board in the test chamber through the tester head.

2. The test system according to claim 1 comprising:
   a first storage unit for temporarily storing the test board prior to testing in the test chamber;
   a second storage unit for temporarily storing the test board subsequent to testing in the test chamber; and
   a transfer robot for removing the test board from the first storage unit and inserting the test board into the test chamber and for removing the test board subsequent to testing from the test chamber and placing the test board in the second storage unit.

3. The test system according to claim 2 comprising:
   a cleaning stage for cleaning the test board after the semiconductor devices have been inserted into the test board; and
   a first moving robot for moving the test board into the first storage unit from the cleaning stage.

4. The test system according to claim 2 comprising a second moving robot for removing the test board from the second storage unit and moving the test board to the semiconductor device extraction station.

5. A semiconductor device test system comprising:
   a semiconductor device insertion station for removing semiconductor devices from a tray and inserting the semiconductor devices into sockets of a test board;
   a semiconductor device extraction station for extracting the semiconductor devices from the sockets and mounting the semiconductor devices on a tray;
   a test chamber for housing the test board during testing and comprising a temperature adjusting mechanism for adjusting the temperature in the test chamber and a compartment having a test board support for supporting the test board, the compartment rotating about an axis between a first position in which the compartment communicates with the temperature adjusting mechanism for adjustment of the temperature within the compartment and a second position for testing of the test board;
   a tester head located outside the test chamber and having a connecting portion for simultaneous electrical connection to electrode terminals of the sockets of the test board, the compartment of the test chamber in its second position opposing the tester head;
   a head moving section for moving the connecting portion of the tester head into and out of electrical contact with the electrode terminals of the test board; and
   a tester electrically connected to the tester head for testing electrical characteristics of the semiconductor devices in the test board in the test chamber through the tester head.

6. The test system according to claim 5 wherein the compartment has a peripheral wall having an opening through which the tester head contacts the electrode terminals of the test board.

7. The test system according to claim 6 wherein the test board support is mounted on the peripheral wall for supporting the test board with the sockets opposing the axis and the electrode terminals opposing the opening in the peripheral wall.

8. The test system according to claim 5 wherein the axis is substantially horizontal.

9. The test system according to claim 5 including a door on the compartment for insertion and removal of the test board in a direction parallel to a plane of the test board.

10. The test system according to claim 5 wherein the test board is horizontally supported when the compartment is in the first position and is vertically supported when the compartment is in the second position.

11. The test system according to claim 5 wherein the compartment includes an inlet and an outlet communicating with the temperature adjusting mechanism when the compartment is in the first position.

12. The test system according to claim 11 wherein the temperature adjusting mechanism includes a heater, a cooler, and a switching mechanism for selectively connecting the inlet with the heater and the cooler.

13. The test system according to claim 11 wherein the compartment includes a partition opposing the test board support and at least partially separating the inlet from the outlet.

14. The test system according to claim 5 wherein the test chamber comprises:
   a plurality of independent temperature adjusting mechanisms for adjusting the temperature in the test chamber; and a plurality of compartments, each compartment having a test board support for supporting the test board and being rotatable about a common axis between a first position in which the compartment communicates with one of the temperature adjusting mechanisms for adjusting the temperature within the compartment and a second position in which the compartment opposes the tester head for testing.

15. The test system according to claim 14 wherein the test chamber comprises four compartments disposed at intervals of 90° about the axis, each compartment including a peripheral wall on which the test board support is mounted and a pair of insulating walls converging from the peripheral wall towards the axis, each peripheral wall having an opening for access by the tester head for testing.

16. The test system according to claim 14 including first and second tester heads disposed on opposite sides of the test chamber and movable by the head moving section towards and away from the test chamber, whereby testing can be simultaneously performed by the first and second tester heads in two of the compartments.

17. A semiconductor device test system comprising:

a plurality of trays each having a plurality of pockets spaced at first and second pitches in first and second orthogonal directions, respectively;

a plurality of test boards each having a plurality of sockets spaced at the first and second pitches in the first and second orthogonal directions, respectively;

a semiconductor device insertion station for transferring semiconductor devices from the pockets of the trays to the sockets of the test boards;

a semiconductor device extraction station for transferring the semiconductor devices from the sockets of the test boards to the pockets of the trays;

a test chamber for housing a plurality of the test boards during testing;

at least one tester head located outside the test chamber;

a head moving section for moving the at least one tester head into and out of electrical contact with electrode terminals of the test boards housed in the test chamber; and a tester electrically connected to the at least one tester head for testing electrical characteristics of the semiconductor devices in the test boards in the test chamber.

18. The test system according to claim 17 wherein the semiconductor device insertion station includes a first location for receiving the trays, a second location for receiving the test boards, a locating stage positioned between the first and second locations, and a robot for transferring the semiconductor devices between the locating stage and the trays at the first location and the test boards at the second location, the locating stage including a plurality of locating holes for receiving the semiconductor devices spaced at first and second pitches in the first and second orthogonal directions, respectively.

19. The test system according to claim 17 wherein the plurality of trays have uniform outer dimensions and include a first tray for housing a first type of semiconductor device and a second tray for housing a second type of semiconductor device different from the first type.

* * * * *